United States Patent
Lachner

(10) Patent No.: US 6,613,644 B2
(45) Date of Patent: Sep. 2, 2003

(54) METHOD FOR FORMING A DIELECTRIC ZONE IN A SEMICONDUCTOR SUBSTRATE

(75) Inventor: Rudolf Lachner, Ingolstadt (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/935,560

(22) Filed: Aug. 22, 2001

(65) Prior Publication Data

US 2002/0052092 A1 May 2, 2002

(30) Foreign Application Priority Data

Aug. 22, 2000 (DE) ......................... 100 41 084

(51) Int. Cl.⁷ .................. H01L 21/336; H01L 21/76
(52) U.S. Cl. ............... 438/424; 438/425; 438/427; 438/439; 438/426; 438/296
(58) Field of Search ................ 438/425, 424, 438/426, 427, 439, 296, 435

(56) References Cited

U.S. PATENT DOCUMENTS

| | | | |
|---|---|---|---|
| 5,563,343 A | | 10/1996 | Shaw et al. ............... 73/514.18 |
| 5,650,354 A | * | 7/1997 | Himi et al. .................. 438/152 |
| 5,665,622 A | * | 9/1997 | Muller et al. ............... 438/243 |
| 5,665,632 A | * | 9/1997 | Lur et al. .................... 438/422 |
| 5,665,633 A | * | 9/1997 | Meyer ........................ 438/427 |
| 5,756,389 A | * | 5/1998 | Lim et al. ................... 438/425 |
| 5,834,359 A | * | 11/1998 | Jeng et al. .................. 438/425 |
| 5,926,713 A | * | 7/1999 | Hause et al. ................ 438/296 |
| 5,943,578 A | * | 8/1999 | Katakabe et al. ........... 438/359 |
| 6,130,139 A | * | 10/2000 | Ukeda et al. ............... 438/424 |
| 6,187,683 B1 | * | 2/2001 | De Santi et al. ............ 438/697 |
| 6,204,149 B1 | * | 3/2001 | Batra et al. ................. 438/435 |
| 6,245,642 B1 | * | 6/2001 | Satoh ......................... 438/427 |
| 6,380,078 B1 | * | 4/2002 | Liu et al. .................... 438/638 |
| 6,391,792 B1 | * | 5/2002 | Jang et al. .................. 438/734 |
| 6,444,517 B1 | * | 9/2002 | Hsu et al. ................... 438/238 |
| 6,482,716 B1 | * | 11/2002 | Wohlfahrt ................... 438/427 |

FOREIGN PATENT DOCUMENTS

| | | |
|---|---|---|
| DE | 198 54 187 A1 | 12/1999 |
| EP | 0 021 147 A2 | 1/1981 |
| JP | 404373146 A | * 12/1992 |
| JP | 404373146 A | * 12/1992 |
| JP | 405013560 A | * 1/1993 |
| JP | 405190663 A | * 7/1993 |
| JP | 406029378 A | * 2/1994 |
| JP | 406029378 A | * 2/1994 |
| WO | WO 97/45873 | 12/1997 |

* cited by examiner

Primary Examiner—Caridad Everhart
Assistant Examiner—Chuong A Luu
(74) Attorney, Agent, or Firm—Laurence A. Greenberg; Werner H. Stemer; Ralph E. Locher

(57) ABSTRACT

A method for forming a dielectric zone in a region of a semiconductor substrate is described. A first trench and a second trench are formed in the region of the semiconductor substrate resulting in a web being formed between the first trench and the second trench. Afterward, a first dielectric layer is deposited in the first trench and the second trench. The web is subsequently removed, a third trench thereby being produced in the semiconductor substrate. Afterwards, a second dielectric layer is formed in the third trench. The first dielectric layer and the second dielectric layer together form a dielectric zone in the semiconductor substrate, on which it is advantageously possible to dispose components with substrate decoupling.

9 Claims, 5 Drawing Sheets

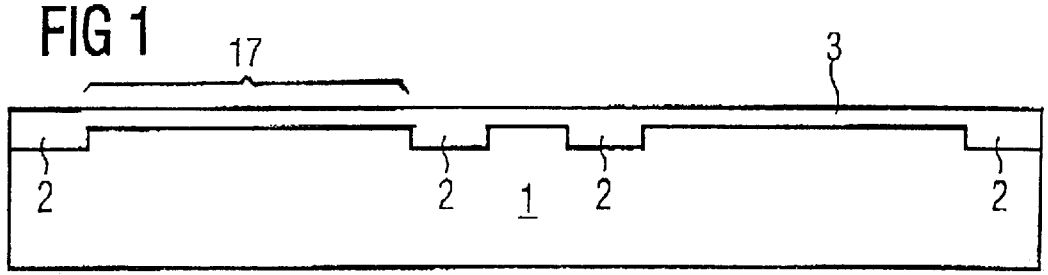
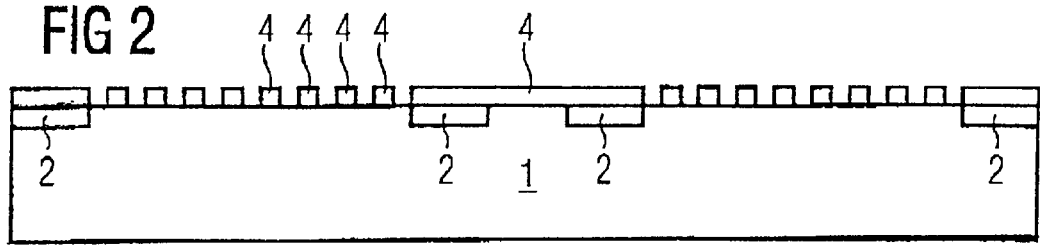
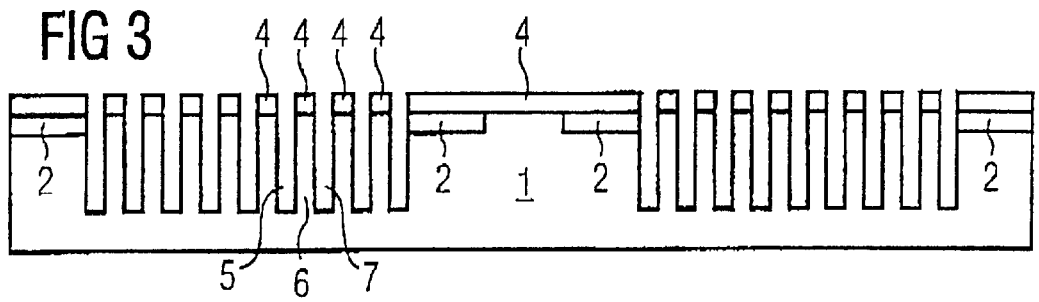
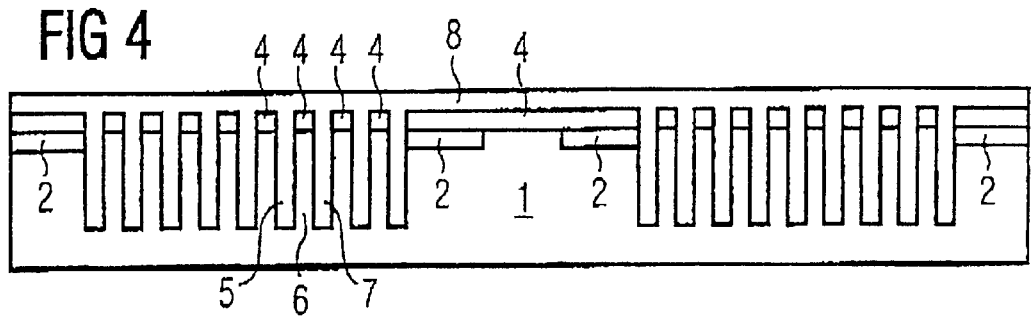

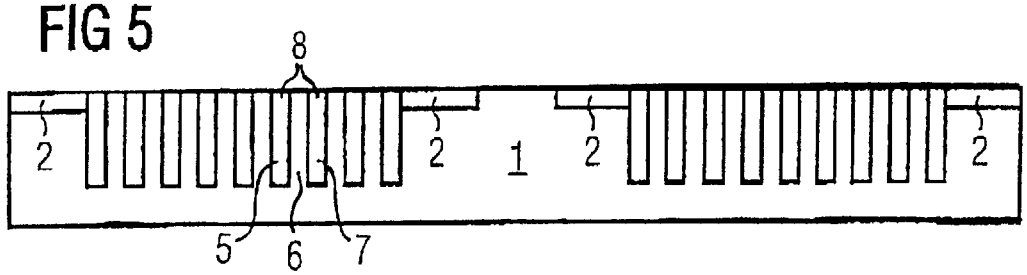
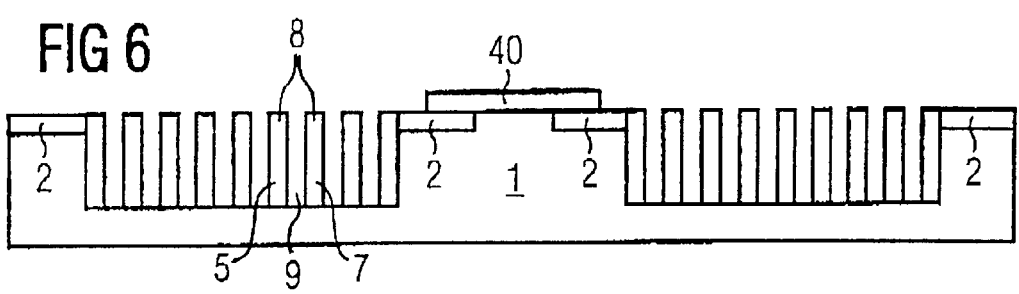
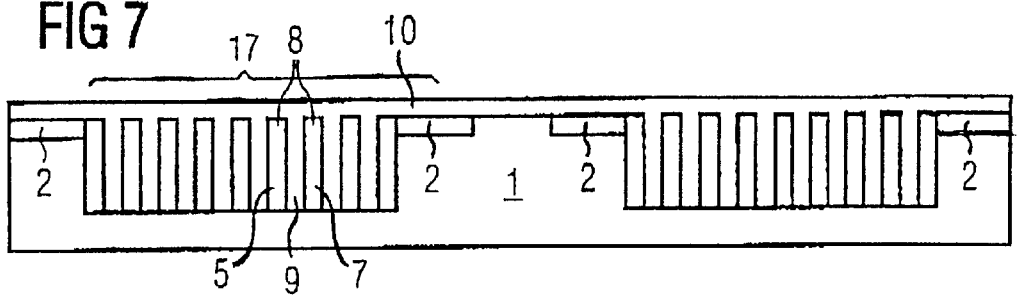
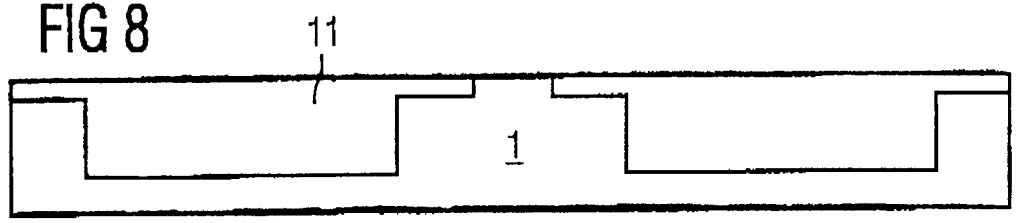

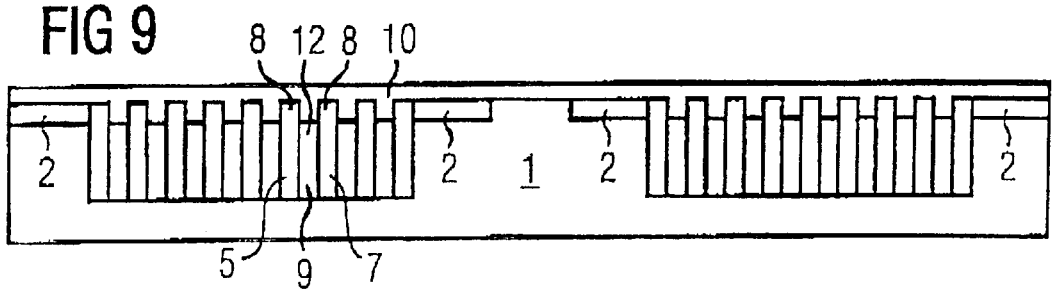
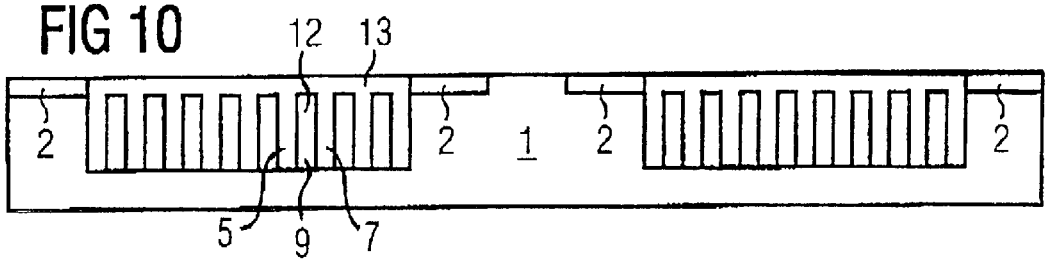
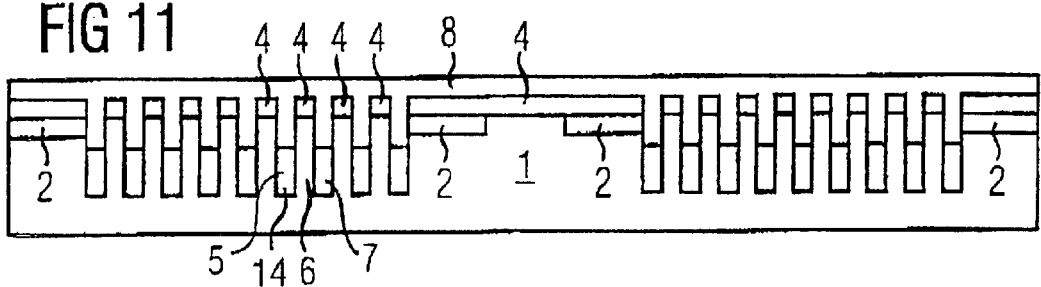
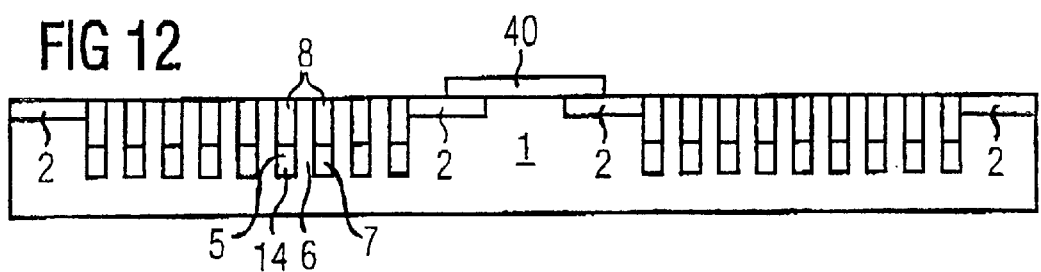

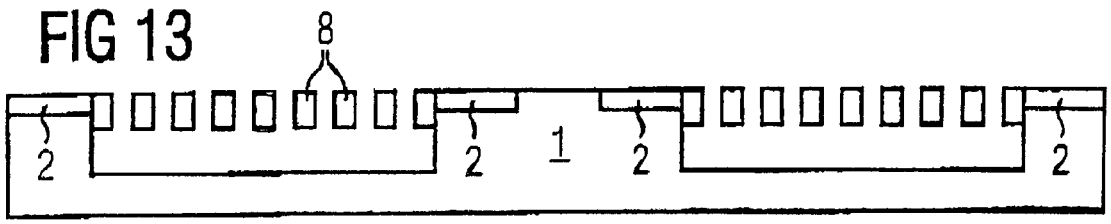
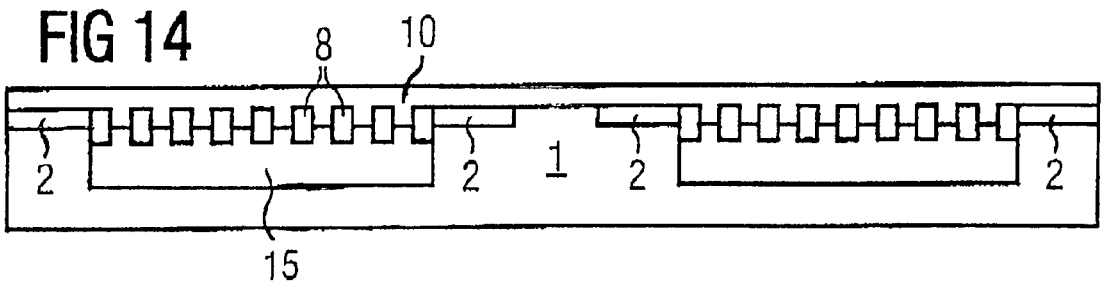
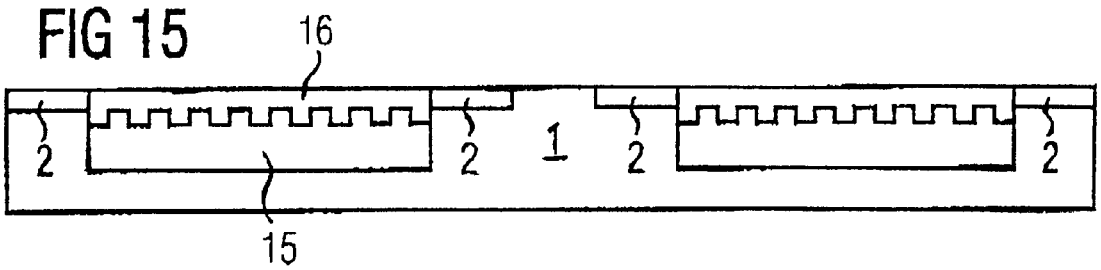

METHOD FOR FORMING A DIELECTRIC ZONE IN A SEMICONDUCTOR SUBSTRATE

BACKGROUND OF THE INVENTION

Field of the Invention

The present patent application relates to a method for forming a dielectric zone in a semiconductor substrate.

The electrical performance of integrated passive components such as polysilicon resistances, polysilicon—polysilicon and/or metal—metal capacitances and also coils is often impaired by parasitic capacitive coupling with the semiconductor substrate used. This occurs in particular when semiconductor substrates having a low conductivity are used. The capacitive substrate coupling can lead to a drastic impairment of radio frequency components. In order to decouple the components from the substrate, a dielectric insulating layer may be disposed locally under the components to be insulated. In this case, the thicker the dielectric layer is made, the better the decoupling of the components from the substrate. There are already various possibilities for producing thick insulation layers. In order to insulate inductances that are realized in the topmost metal plane, it is possible to use very thick, organic spin-on layers such as polyamide. However, owing to their temperature sensitivity, these materials can only be used at the end of the process. Furthermore, these layers have the disadvantage that subsequent high-resolution patterning is made more difficult on account of the large layer thickness of approximately 10 $\mu$m. Therefore, these layers can only be used for insulating the last metal plane, in which the contact hole openings to underlying layers can be formed without fine patterning and, consequently, occupy a large proportion of the substrate surface.

A further method for decoupling the components from the substrate consists in removing the substrate under the components in a large-area manner. As a result, the components are disposed in a freely suspended manner above the substrate. Although this procedure affords good decoupling, the mechanical stability of the structure is susceptible to disturbances and tends to oscillate. Furthermore, it is difficult to package the circuits in a housing since the freely suspended components should not be damaged.

Furthermore, it is possible to form very thick dielectric layers for example by chemical vapor deposition (CVD) methods or thermal oxidation on the substrate. However, these methods have the disadvantage that they are extremely slow and thus work uneconomically. A further disadvantage is that the thick dielectric layers are not produced locally but rather over the entire wafer. This has the disadvantage that subsequent patterning of the thick layer can only be effected in a coarse fashion and fine patterning is made more difficult. Furthermore, the thick dielectric layer produces an extremely unfavorable topography on the substrate surface, thereby making the subsequent process steps more difficult.

SUMMARY OF THE INVENTION

It is accordingly an object of the invention to provide a method for forming a dielectric zone in a semiconductor substrate which overcomes the above-mentioned disadvantages of the prior art methods of this general type, which has an increased thickness and an improved planarity.

With the foregoing and other objects in view there is provided, in accordance with the invention, a method for forming a dielectric zone in a region of a semiconductor substrate. The method includes the steps of forming a first trench and a second trench in the region of the semiconductor substrate resulting in a web being formed between the first trench and the second trench; providing a first dielectric layer in the first trench and the second trench; removing the web, a third trench thereby being produced; and providing a second dielectric layer in the third trench.

By way of example, the invention forms the first and the second trench, resulting in a web being produced between the two trenches. If it is envisaged that a relatively large region of the substrate surface is to be provided with a dielectric zone, then, for example, a whole series of trenches with intervening webs are formed. In this case, the trenches can be formed with a depth that corresponds to the subsequent thickness of the dielectric zone. The trenches are then filled with the first dielectric layer, it merely being necessary to deposit a layer thickness that approximately corresponds to half the trench width. This process is fast and very inexpensive in comparison with a thick layer thickness of the dielectric layer. A web between the deposited first dielectric layer is subsequently removed, a first trench thereby being produced. The third trench is formed, for example, with a depth which approximately corresponds to the depth of the previously formed first trench and thus to the filling depth of the first dielectric layer. This makes it possible to fabricate very thick dielectric layers in a semiconductor substrate, the fabrication being realized not by the deposition of correspondingly large layer thicknesses but by the conformal filling of very deep trenches. For filling the trenches, all that is required is a layer thickness that approximately corresponds to half the trench width.

In an advantageous development of the method according to the invention, the first dielectric layer is planarized. This procedure has the advantage that the web between the first and second trenches is uncovered by the planarization step and can be removed in a subsequent etching step. Furthermore, the planarization step has the advantage of avoiding a topological step between the surface of the semiconductor substrate and the dielectric zone.

A further refinement of the method according to the invention provides for the web to be removed by isotropic or by anisotropic etching. Since the web is disposed between two trenches filled with a dielectric material, the web can be etched by isotropic etching that selectively removes the web with respect to the dielectric layer in the first and second trenches. Anisotropic etching is likewise possible, which uses reactive ion etching, for example, and is selective with respect to a resist mask, with respect to a hard mask or with respect to the material difference between web and dielectric layer.

Furthermore, it is provided that a hard mask is used for forming the first trench. The use of a hard mask has the advantage that the first trench and/or the second trench can be formed with a large trench depth.

Furthermore, it is provided that a resist mask is used for forming the third trench. The resist mask may serve during isotropic etching, for example, for uncovering a window in which the web is disposed, so that the rest of the substrate is protected from the etching.

A further refinement of the method according to the invention provides for the first dielectric layer to be formed in an upper region of the first trench and a cavity to be produced in a lower region that is disposed below the upper region. The cavity has the advantage that improved decoupling between the substrate and the component is achieved.

Furthermore, it is provided that the second dielectric layer is formed in an upper region of the third trench and a second cavity is produced in a lower region that is disposed below the upper region. The second cavity has the advantage that the decoupling between the substrate and the component is improved further.

Furthermore, it is provided that the first cavity and the second cavity are formed in a contiguous manner. The contiguous formation of the first and the second cavities has the advantage that improved decoupling between the substrate and a component disposed on the dielectric zone is achieved.

Other features which are considered as characteristic for the invention are set forth in the appended claims.

Although the invention is illustrated and described herein as embodied in a method for forming a dielectric zone in a semiconductor substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, sectional view of a substrate with an isolation trench according to the invention;

FIG. 2 is a sectional view of the substrate in accordance with FIG. 1, on which a mask is formed;

FIG. 3 is a sectional view of the substrate in accordance with FIG. 2, the mask having being used for etching trenches;

FIG. 4 is a sectional view of the substrate in accordance with FIG. 3, the trenches being filled with a dielectric layer;

FIG. 5 is a sectional view of the substrate in accordance with FIG. 4, the substrate surface being planarized;

FIG. 6 is a sectional view of the substrate from FIG. 5, a web having being etched out between the dielectric layers and a trench having been formed;

FIG. 7 is a sectional view of the substrate in accordance with FIG. 6, a second dielectric layer being disposed on the substrate and in a trench;

FIG. 8 is a sectional view of the substrate in accordance with FIG. 7, the first dielectric layer and the second dielectric layer being represented as a dielectric zone;

FIG. 9 is a sectional view showing a process variant that follows FIG. 6, the second dielectric layer being deposited on the substrate, and a cavity being formed;

FIG. 10 is a sectional view of the substrate in accordance with FIG. 9, the substrate surface being planarized;

FIG. 11 is a sectional view showing a process variant which follows FIG. 3, the first dielectric layer being deposited on the substrate surface and forming a cavity in the substrate in one of the previously etched trenches;

FIG. 12 is a sectional view of the substrate in accordance with FIG. 11, the substrate surface having been planarized;

FIG. 13 is a sectional view of the substrate in accordance with FIG. 12, a web that was disposed between two trenches being removed;

FIG. 14 is a sectional view of the substrate according to FIG. 13, the second dielectric layer being deposited on the substrate surface and a cavity being formed in the substrate;

FIG. 15 is a sectional view of the substrate in accordance with FIG. 14, the first dielectric layer and the second dielectric layer forming a dielectric diaphragm that straddles a cavity;

DESCRIPTION OF PREFERRED EMBODIMENTS

Figure 16:
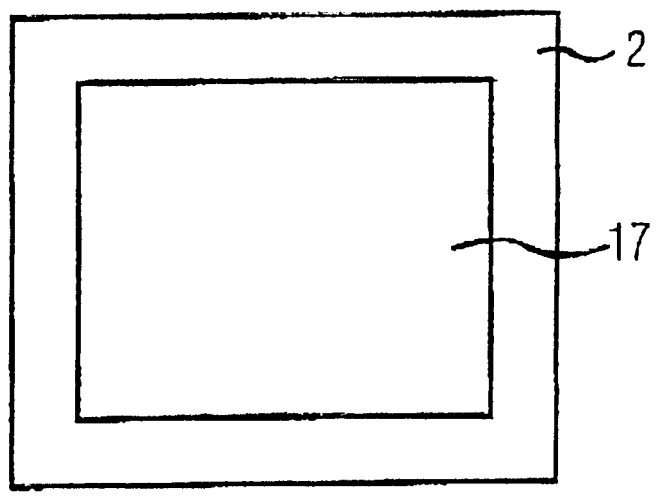
FIG. 16 is a plan view of the substrate, with the configuration of a trench isolation.

In all the figures of the drawing, sub-features and integral parts that correspond to one another bear the same reference symbol in each case. Referring now to the figures of the drawing in detail and first, particularly, to FIG. 1 thereof, there is shown a substrate 1 in which a trench isolation 2 is disposed. The trench isolation 2 has been formed for example by the deposition of an insulation layer 3 onto the surface of the substrate 1. Furthermore, a region 17 of the semiconductor substrate 1 is illustrated.

With regard to FIG. 2, the insulation layer 3 has been removed from the surface of the substrate 1, the surface of the substrate 1 having been planarized for example by a chemical mechanical polishing (CMP) step. A mask 4 is disposed on the surface of the substrate 1, which mask is patterned.

A subsequent process step in accordance with FIG. 3 provides the formation of a first trench 5 and of a second trench 7, a web 6 remaining between the first trench 5 and the second trench 7. The web 6 is masked by the mask 4, for example, so that the etching step carried out for forming the first trench 5 and the second trench 7 leaves behind the web 6. The etching for forming the first trench 5 and the second trench 7 is carried out anisotropically, for example, in order to form a trench having a high aspect ratio (trench depth to trench diameter). The trench can be formed by a reactive ion etching (REI) step, for example. The substrate 1 is formed from silicon, for example. The trench isolation 2 is formed as a shallow trench isolation (STI) and is formed, for example, from silicon oxide or a doped silicon oxide or silicate glass. The mask 4 is formed as a hard mask and may contain silicon oxide or silicon nitride, for example.

With regard to FIG. 4, a first dielectric layer 8 is formed on the surface of the substrate 1 and on the surface of the mask 4 and in the first trench 5 and the second trench 7. If the first dielectric layer 8 is deposited conformally, then a layer thickness which approximately corresponds to half the trench width of the first trench 5 and of the second trench 7 is required for filling the first trench 5 and the second trench 7, respectively. By way of example, a CVD process can be used for this purpose. The first dielectric layer 8 may contain silicon oxide or silicon nitride, for example.

With regard to FIG. 5, the surface of the substrate 1 is processed in such a way that the first dielectric layer 8 and the mask 4 are removed from the surface of the substrate 1. This can be carried out by a CMP step, for example. The CMP step furthermore has the advantage that the surface of the substrate 1 is planarized. The planarization is advantageously advanced to an extent such that the surface of the web 6 is uncovered.

In FIG. 6, a noncritical mask 40 is disposed in such a way that it overlaps the trench isolation 2, for example, and thus uncovers the substrate 1 in a region in which a dielectric zone 11 is to be formed, and protects the substrate 1 in a region in which active components can be formed. No high-resolution lithographic conditions are imposed on the noncritical mask 40 since the trench isolation 2 is coarsely patterned. Afterward, the web 6 is removed. This is possible for example by anisotropic or isotropic etching. In this case, the etching can be carried out for example in a self-aligned manner with respect to the oxide webs which are already present in the first trench 5 and the second trench 7 and are composed of the first dielectric layer 8.

With regard to FIG. 7, the noncritical mask 40 is removed and a second dielectric layer 10 is formed on the surface of the substrate 1 and on the first dielectric layer 8 in the first trench 5 and the second trench 7. The second dielectric layer 10 can be deposited by a CVD process, for example. In this case, a third trench 9 is filled, for example. To that end, a layer thickness that approximately corresponds to half the trench width of the third trench 9 is required for the second dielectric layer 10.

With regard to FIG. 8, a CMP step is carried out which planarizes the surface of the substrate 1 and removes the second dielectric layer 10 from the surface of the substrate 1. The first dielectric layer 8 and the second dielectric layer 10 form the dielectric zone 11. The second dielectric layer 10 may likewise contain silicon oxide or silicon nitride.

With regard to FIG. 9, a process variant that follows FIG. 6 is illustrated. It is provided that the third trench 9 is not filled completely, rather a first cavity 12 is formed in the region of the third trench 9. To that end, on the structure illustrated in FIG. 6, after the removal of the noncritical mask 40, the second dielectric layer 10 is formed on the substrate 1. The cavity 12 is produced by forming the second dielectric layer 10 with a reduced edge coverage, the trench 9 being closed in its upper region before the trench 9 is completely filled. The relative permittivity of a cavity is of the order of magnitude of 1, which may constitute an improvement compared with the material of the first dielectric layer 8 and of the second dielectric layer 10. If the first dielectric layer 8 is composed of silicon oxide, for example, then it has a relative permittivity of 4. This improves the decoupling of components that are formed on the dielectric zone 11.

With regard to FIG. 10, the planarization of the surface of the substrate 1 is carried out, the second dielectric layer 10 being partly removed from the substrate surface.

FIG. 11 show a further process variant, which follows the structure illustrated in FIG. 3. The first trench 5 and the second trench 7 are partly filled, the first dielectric layer 8 closing off the trenches in an upper region of the trenches and a second cavity 14 is formed in a lower region of the first trench 5. To that end, it is possible to use a deposition process that has a reduced edge coverage, so that the first trench 5 is closed in its upper region before the first trench 5 is completely filled, the second cavity 14 thereby being formed in the lower region of the trench 5. The relative permittivity of the cavity is of the order of magnitude of 1, which constitutes an improvement compared with a silicon oxide having a relative permittivity of about 4.

With regard to FIG. 12, the surface of the substrate 1 is etched back and planarized, the first dielectric layer 8 again being partly removed. Afterward, a noncritical mask 40 is disposed on the surface of the substrate, which partly overlaps the trench isolation 2, for example.

With regard to FIG. 13, an etching process is carried out during which the web 6 disposed between the first trench 5 and the second trench 7 is removed, the trenches each being filled with the first dielectric layer 8 in their upper region.

With regard to FIG. 14, the second dielectric layer 10 is formed on the surface of the substrate 1. For this purpose, too, use is made of a deposition process that has a reduced edge coverage, so that the second dielectric layer 10 is formed between the freely suspended structures of the first dielectric layer 8.

With regard to FIG. 15, the first dielectric layer 8 and the second dielectric layer 10 form a dielectric diaphragm 16, which straddles a third cavity 15.

FIG. 16 shows a plan view of a substrate 1 having a closed ring as the trench isolation 2.

Figure 17:
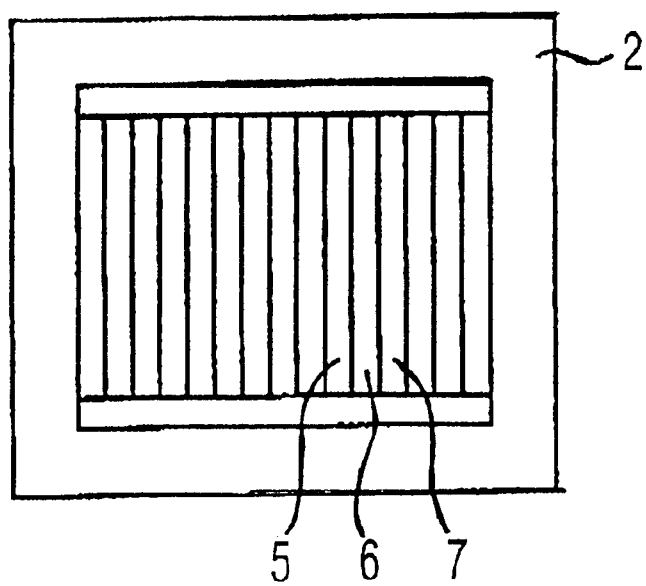
FIG. 17 is a plan view showing the substrate from FIG. 16, a first trench, a web and a second trench being illustrated.

FIG. 17 shows a plan view in accordance with FIG. 16, in which the first trench 5, the web 6 and the second trench 7 are formed in an inner area surrounded by the trench isolation 2, the web 6 being disposed between the first trench 5 and the second trench 7.

I claim:

1. A method for forming a dielectric zone in a region of a semiconductor substrate, which comprises the steps of:

forming a first trench and a second trench in the region of the semiconductor substrate resulting in a web being formed between the first trench and the second trench;

providing a first dielectric layer in an upper region of the first and second trenches and forming a first cavity in a lower region of the first trench below the upper region of the first trench and terming a second cavity in a lower region of the second trench below the upper region of the second trench;

providing a first dielectric layer in the first trench and the second trench;

removing the web, a third trench thereby being produced;

wherein the first, second, and third trenches have an aspect ratio of greater than 1; and providing a second dielectric layer in an upper region of the third trench and forming a third cavity contiguous with the first cavity in a lower region of the third trench below the upper region of the third trench.

2. The method according to claim 1, which comprises planarizing the first dielectric layer.

3. The method according to claim 1, which comprises removing the web with one of isotropic etching and anisotropic etching.

4. The method according to claim 1, which comprises using a mask for forming the first trench.

5. The method according to claim 1, which comprises using a mask selected from the group consisting of resist masks and hard masks for forming the third trench.

6. The method according to claim 1, which comprises providing the first dielectric layer in an upper region of the first trench and a cavity is formed in a lower region of the first trench that is disposed below the upper region of the first trench.

7. The method according to claim 6, which comprises providing the second dielectric layer in an upper region of the third trench and a further cavity is formed in a lower region of the third trench which is disposed below the upper region of the third trench.

8. The method according to claim 7, which comprises forming the cavity and the further cavity in a contiguous manner.

9. The method according to claim 1, which comprises forming the third cavity contiguous with the first and second cavities.

* * * * *

UNITED STATES PATENT AND TRADEMARK OFFICE
CERTIFICATE OF CORRECTION

PATENT NO. : 6,613,644 B2
DATED : September 2, 2003
INVENTOR(S) : Rudolf Lachner It is certified that error appears in the above-identified patent and that said Letters Patent is hereby corrected as shown below:

Column 6,
Line 25, should read as follows:
-- of the first trench and forming a second cavity in a --

Signed and Sealed this

Thirtieth Day of December, 2003

JAMES E. ROGAN
*Director of the United States Patent and Trademark Office*